Nov. 7, 1961 A. B. PRZEDPELSKI 3,008,095

FREQUENCY-MODULATED OSCILLATOR

Filed Aug. 25, 1958 2 Sheets-Sheet 1

Inventor
Andrzej B. Przedpelski
By: Graf, Nierman & Burmeister
Attorneys

Nov. 7, 1961 A. B. PRZEDPELSKI 3,008,095

FREQUENCY-MODULATED OSCILLATOR

Filed Aug. 25, 1958 2 Sheets-Sheet 2

INVENTOR.
Andrzej B. Przedpelski
BY
Graf, Nierman & Burmeister
Attorneys

United States Patent Office
3,008,095
Patented Nov. 7, 1961

3,008,095
FREQUENCY-MODULATED OSCILLATOR

Andrzej B. Przedpelski, Forest Park, Ill., assignor to A.R.F. Products, Inc., River Forest, Ill., a corporation of Illinois Filed Aug. 25, 1958, Ser. No. 756,756
8 Claims. (Cl. 332—18)

The present invention relates generally to frequency-modulated oscillators, and more particularly to frequency-modulated oscillators which are tunable over a frequency range.

One of the problems in the design of frequency-modulation systems is to avoid distortion introduced in frequency-modulating the oscillator. The frequency control element of an oscillator may be a ferrite cored reactor, however, such reactors exhibit frequency instability with temperature changes and also with changes in flux density. Most ferrite materials exhibit a positive temperature coefficient at very low flux densities, and this coefficient becomes negative at higher flux densities. Harmonic distortion also occurs when an oscillator is modulated by varying the voltage applied to a silicon diode connected in parallel with the tank circuit of the oscillator.

It is one of the objects of the present invention to provide a frequency-modulated oscillator with means for reducing distortion caused by the modulation process.

Negative feedback has been employed in many devices to reduce distortion. However, it is difficult to employ negative feedback to reduce the distortion of a frequency-modulated oscillator which is tunable over a frequency range. If a discriminator is employed to generate the negative feeback signal, the discriminator must be accurately tracked with the frequency of the oscillator.

It is a further object of the present invention to provide a frequency-modulated oscillator which is tunable over a frequency range with means to minimize modulation introduced distortion.

Frequency stability of frequency-modulated oscillators has been the subject of much consideration, and it is conventional to employ a discriminator to generate a potential for the purpose of controlling the center frequency of a frequency-modulated oscillator. However, it is not practical to employ a discriminator in combination with an oscillator which is tunable over a frequency range, because of the fact that the discriminator must be tracked with great accuracy with the frequency of the oscillator.

It is one of the objects of the present invention to provide a stabilized adjustable-frequency frequency-modulated oscillator.

Figure 1:
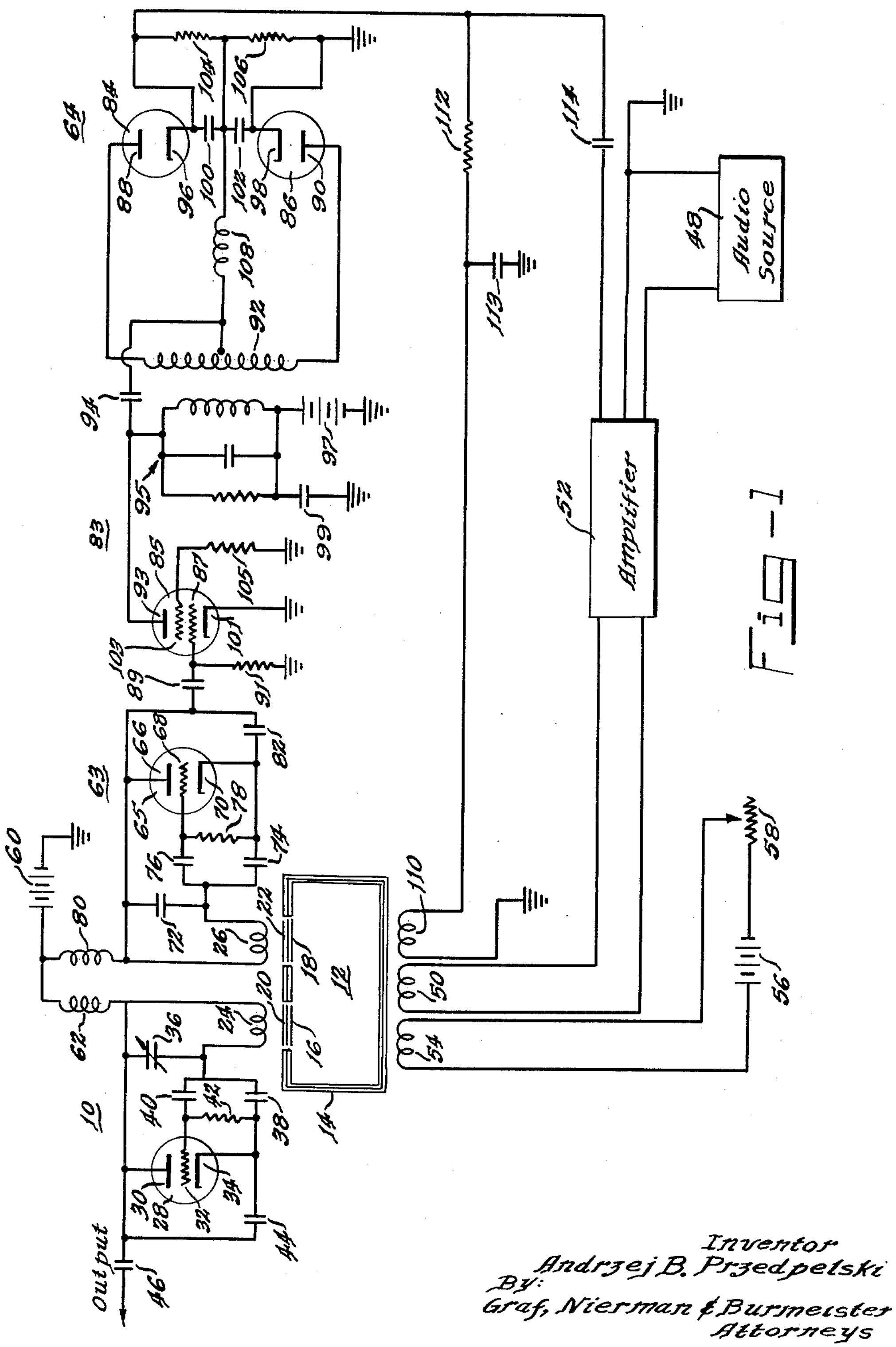
Figure 2:
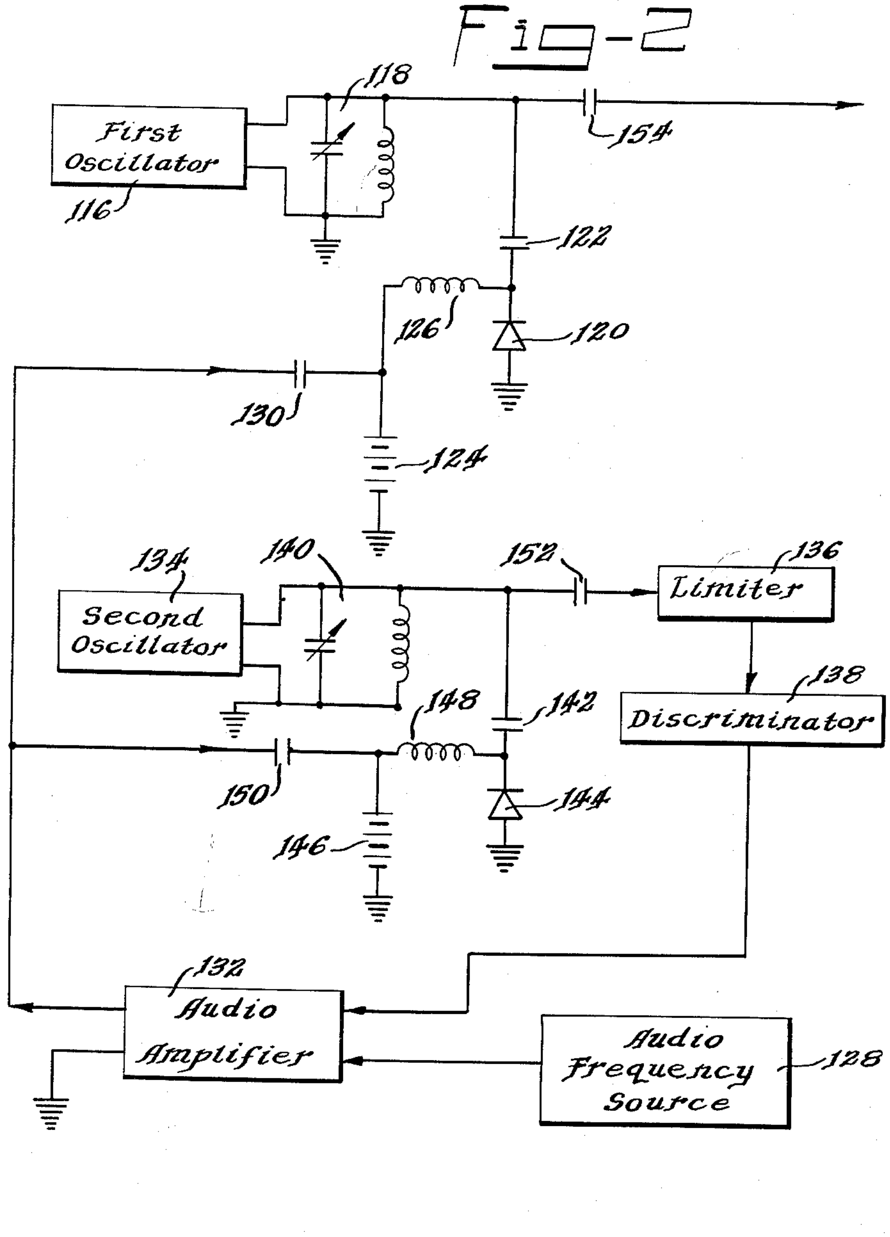

Other objects and advantages of the present invention will become more clearly apparent from a further reading of this disclosure, particularly when viewed in the light of the drawings, in which:

FIGURE 1 is a schematic electrical diagram of a frequency stabilized frequency-modulated oscillator constructed according to the teachings of the present invention; and FIGURE 2 is another embodiment of the present invention illustrating a frequency-modulated tunable oscillator provided with distortion compensating means.

The frequency-modulated oscillator 10 illustrated in FIGURE 1 employs a ferrite cored reactor 12. The reactor 12 employs a yoke 14 constructed of high permeability materials, such as iron, and provided with two gaps 16 and 18. Ferrite members 20 and 22 are disposed within the gaps 16 and 18, and coils 24 and 26 are disposed about the ferrite cores 20 and 22, respectively.

The oscillator 10 employs a Colpitts circuit, although it is to be understood that other conventional oscillator circuits may be employed. The oscillator 10 has a vacuum tube 28 with a plate 30, grid 32 and cathode or current return electrode 34. A variable capacitor 36 is connected in parallel with the coil 24, thus forming a tank circuit, and the tank circuit is connected between the plate 30 and cathode 34 of the oscillator 10, a capacitor 38 being connected between the cathode 34 and the tank circuit. The grid 32 is also connected to the tank circuit through a capacitor 40, and to the cathode 34 through a resistor 42. The plate 30 is also connected to the cathode 34 through a capacitor 44. The frequency-modulated radio frequency output of the oscillator 10 appears on the plate 30 of vacuum tube 28, and may be coupled to external equipment through an output capacitor 46.

A source of audio signals 48 for modulating the oscillator 10 is connected in series with a coil 50 disposed about the magnetic yoke 14 of the reactor 12 through an amplifier 52. The signals from the audio source 48 vary the magnetic flux density in the yoke 14, and hence the inductance of the coil 24 in the tank circuit of the oscillator 10, thereby frequency-modulating the oscillator at the audio rate and at an amplitude monotonically related to the amplitude of the audio signal from the source 48. The flux density in the magnetic core 14 also has a direct component resulting from the flux introduced through a coil 54 disposed about the yoke 14 and connected to a direct current source 56, such as a battery. The center frequency of the oscillator 10 is determined by adjusting a potentiometer 58 in series with the coil 54 and battery 56 as well as adjusting the capacitor 36. Power for the oscillator 10 is provided by a direct current source, such as the battery 60 connected to the plate 30 through a radio frequency choke 62.

Both frequency drift and distortion of the frequency-modulated oscillator 10 are minimized by a fixed-frequency frequency-modulated oscillator 63 and a discriminator 64 which generate a feeback signal. The fixed-frequency oscillator 63 has a frequency determining circuit including the coil 26 of the reactor 12, so that the instabilities of the reactor 12 are impressed upon the fixed-frequency frequency-modulated oscillator 63 in a manner identical to the tunable-frequency frequency-modulated oscillator 10. The discriminator 64 develops an audio response which is combined out of phase with the audio signals from the source 48 to minimize distortion introduced into the frequency-modulated oscillator 10 by the reactor 12, and also a direct current potential responsive to the frequency drift of the oscillator 63 which is employed to vary the direct flux component in the reactor 12 to stabilize the frequencies of the oscillators 10 and 63.

The oscillator 63 employs the same circuit as the oscillator 10, and has a vacuum tube 65 with a plate 66, grid 68, and current return electrode in the form of a cathode 70. A capacitor 72 is connected in parallel with the coil 26 and forms a tank circuit for the oscillator 63 which is connected between the plate 66 and cathode 70 through a capacitor 74. The grid 68 is also connected to the tank circuit through a capacitor 76 and to the cathode 70 through a resistor 78. An RF choke 80 connects the positive terminal of the direct current source 60 to the plate 66 of vacuum tube 65. A capacitor 82 is connected between the plate 66 and the cathode 70.

As illustrated in FIGURE 1, the oscillator 63 is connected to the discriminator 64 through a limiter 83 to remove amplitude modulation. The limiter 83 has a vacuum tube 85 with a grid 87 connected to the plate 66 of the oscillator 63 through a capacitor 89. A grid resistor 91 is connected between the grid 87 and ground. The plate 93 of vacuum tube 85 is connected to a low Q tank circuit 95, and in series with a power source 97. The power source 97 is provided with a by-pass capacitor 99. The cathode 101 of vacuum tube 85 is connected to ground, and the suppressor grid 103 is connected to the cathode 101 through a resistor 105.

The discriminator 64 employs two diodes 84 and 86. The diodes 84 and 86 have plates 88 and 90, respectively, which are interconnected by a center tapped coil 92. The tap of the coil 92 is connected to the plate 93 of the limiter 83 through a capacitor 94, and the coil 92 is coupled to the coil of the tank circuit 95. The diodes 84 and 86 have cathodes 96 and 98, respectively, which are interconnected by capacitors 100 and 102 connected in series. The cathodes 96 and 98 are also interconnected by resistors 104 and 106 connected in series, and the junctions between the resistors 104 and 106 and the capacitors 100 and 102 are interconnected and connected to the tap of the coil 92 by a choke 108. The output of the discriminator 64 is taken from the cathode 96, and the cathode 98 is connected to a common ground connector.

The reactor 12 has a third control coil 110 which is connected to the cathode 96 of the discriminator 64 through a resistor 112. A by-pass capacitor 113 is connected from the junction of resistor 112 and coil 110 to the common ground connector. The control coil 110 varies the magnetic flux in the core 14 in response to the direct current output of the discriminator 64 to oppose a change in frequency of the oscillator 63. Since changes in frequency of the oscillator 63 resulting from changes in the characteristics of the reactor 12 are common to both the oscillator 63 and oscillator 10, the frequency of the oscillator 10 is also stabilized.

The cathode 96 of the discriminator 64 is also connected to a second input of the amplifier 52 through a capacitor 114, and the alternating current signals representing the audio modulation of the oscillator 63 are phased to oppose the audio signals impressed upon the first input of the amplifier 52 from the audio source 48. In this manner, the distortion of the modulation of the oscillator 63 introduced by the characteristics of the reactor 12 are minimized by negative feedback, and because the reactor 12 is common to both the oscillator 63 and the oscillator 10, distortion of the oscillator 10 is also minimized.

In one particular construction, the oscillator 10 is tunable over the frequency range from 120 to 205 megacycles, and the oscillator 63, limiter 83, and discriminator 64 are operated at the fixed frequency of 10.7 megacycles. A maximum frequency deviation of 150 kilocycles is applied to the oscillators 10 and 63, and under these conditions operation of the oscillator 63 and discriminator 64 reduces the distortion in the modulation of the oscillator 10 from 0.5 percent to 0.05 percent with approximately 20 decibels of negative audio feedback.

The reactor 12 can be constructed with a single gap and a single ferrite core for the coils 24 and 26 at some sacrifice in isolation between the oscillator circuits 10 and 63. It is desirable that both coils 24 and 26 are in the same magnetic flux and isolated from each other.

FIGURE 2 illustrates a frequency-modulated oscillator provided with means for minimizing distortion but not frequency drift except for drift introduced from changes in ambient conditions. A first oscillator which is tunable over a frequency range is schematically illustrated at 116 employing a tank circuit 118 which determines the resonant frequency of the oscillator 116. A silicon diode 120 is connected in series with a capacitor 122, and the diode and capacitor are connected in parallel with the tank circuit 118. A direct current source, such as a battery 124, is connected to the junction between the diode 120 and capacitor 122 by a radio frequency choke 126. The diode 120 is connected to oppose the passage of current from the battery 124. An audio frequency source 128 is connected to the junction between the battery 124 and choke 126 through a capacitor 130 and an amplifier 132 connected in series.

The effective capacity of the silicon junction diode 120 varies with the potential impressed across the diode, and since the capacity is connected in parallel with the tank circuit 118, the audio signals frequency modulate the oscillator 116. However, modulation of the oscillator 116 in this manner is subject to distortion introduced by the diode 120.

The distortion of the modulation of the oscillator 116 is minimized by means including a second oscillator of fixed frequency 134, a limiter 136, and a discriminator 138 which generates a potential coupled to the audio amplifier out of phase with the signals from the audio source 128.

The second oscillator 134 is preferably of the same electrical circuit as the first oscillator 116 and employs a tank circuit 140 for determining its resonant frequency. The second oscillator is preferably a fixed frequency oscillator. A capacitor 142 and silicon junction diode 144 are connected in series, and in parallel with the tank circuit 140. A direct current source, such as a battery 146, is connected across the silicon diode 144 through a radio frequency choke 148, and the output of the audio amplifier 132 is connected to the junction of the battery 146 and choke 148 through a capacitor 150. The diode 144 is connected to oppose the passage of charges from the battery 146 therethrough. The limiter 136 is connected to the tank circuit 140 through a capacitor 152.

Since the first oscillator 116 and the second oscillator 134 employ silicon junction diodes as modulators, the distortion introduced into the oscillators which are characteristic of the silicon junction diodes will be the same for both oscillators, particularly if the characteristics of the diodes are similar. The audio output of the discriminator 138, therefore, constitutes negative feedback for both the first oscillator 116 and the second oscillator 134 and minimizes the distortion introduced by the diodes and other circuit elements varying in the same manner. In this manner, output may be taken from the first oscillator 116, for example through a capacitor 154 connected to the tank circuit 118, with a minimum of distortion. Further, since ambient conditions affecting the diodes 120 and 144 will equally affect both diodes, the feedback will oppose changes in ambient conditions.

Many alternative constructions and modifications of the oscillators herein disclosed will occur as a result of this disclosure. It is, therefore, intended that the scope of the present invention be not limited to the foregoing disclosure, but rather only by the appended claims.

The invention claimed is:

1. A frequency-modulated oscillator comprising a first oscillator having an input for electrical signals to vary the frequency thereof, a second oscillator having an input for electrical signals to vary the resonant frequency thereof, a source of alternating electrical signals connected to the inputs of the first and second oscillators for frequency-modulating the oscillators, a discriminator having an input connected to the second oscillator and an output, and means to connect the output of the discriminator to the inputs of the first and second oscillators out of phase with the alternating electrical signals.

2. A frequency-modulated oscillator comprising a first oscillator having a frequency determining circuit including a first coil, said first coil having a core of magnetic material, a second oscillator having a frequency determining circuit including a second coil, said second coil having a core of magnetic material, a magnetic circuit including the core of the first coil and the core of the second coil, a source of alternating electrical signals, means connected to the source of alternating electrical signals for impressing an alternating magnetic flux on the magnetic circuit and means to vary the flux in the magnetic circuit responsive to a change in frequency of the second oscillator to oppose said change of frequency.

3. A frequency-modulated oscillator comprising a first oscillator having a frequency determining circuit including a first coil, said first coil having a core of magnetic material, a second oscillator having a frequency determining circuit including a second coil, said second coil having a core of magnetic material, a magnetic circuit including the cores of the first and second coils, means to establish a magnetic flux in said magnetic circuit alternating at an audio rate, thereby frequency-modulating the first and second oscillators, means to generate an audio signal responsive to the frequency-modulation of the second oscillator, and means connected to the audio signal generating means and coupled to the magnetic circuit to oppose the alternating flux therein.

4. A frequency-modulated oscillator comprising, in combination, a reactor having a magnetic circuit and three coils disposed about the circuit, a first oscillator having a first tank circuit including the first of said coils, a second oscillator having a second tank circuit including the second of said coils, a discriminator coupled to the second oscillator having a direct current output responsive to frequency, the discriminator output being coupled to the third coil of the reactor to oppose the change in frequency producing the discriminator output, an electrical alternating current source, and means connected to the electrical alternating current source for impressing an alternating magnetic flux on the magnetic circuit.

5. A frequency-modulated oscillator comprising, in combination, a reactor having a magnetic circuit and four coils disposed about the circuit, a first oscillator having a first tank circuit including the first of said coils, a second oscillator having a second tank circuit including the second of said coils, a discriminator coupled to the second oscillator having an output, the discriminator output having a direct current component coupled to the fourth coil responsive to frequency and an alternating current component coupled to the third coil responsive to the modulation of the second oscillator, and an audio source connected to the third coil of the reactor out of phase with the alternating current component of the output of the discriminator.

6. A frequency-modulated oscillator comprising the elements of claim 1 wherein the first oscillator is provided with a first frequency determining tank circuit, a first silicon diode connected in parallel therewith, and a first direct current source connected in series with the first diode and polarized to pass positive charges in the opposite direction from the diode; and the second oscillator is provided with a second frequency determining tank circuit, a second silicon diode connected in parallel therewith, and a second direct current source connected in series with the second diode and polarized to pass positive charges in the opposite direction from the second diode.

7. A frequency-modulated oscillator comprising the elements of claim 6 wherein the means to connect the output of the discriminator to the input of the first and second oscillators comprises electrical circuit means for connecting the output of the discriminator in parallel with the first and second diodes out of phase with the audio frequency source.

8. A frequency-modulated oscillator comprising the elements of claim 7 in combination with a limiter connected between the second oscillator and the discriminator.

References Cited in the file of this patent

UNITED STATES PATENTS

| | | |
|---|---|---|
| 2,170,812 | Lange | Aug. 29, 1939 |
| 2,245,627 | Varian | June 17, 1941 |
| 2,559,023 | McCoy | July 3, 1951 |
| 2,583,138 | Carter et al. | Jan. 22, 1952 |
| 2,757,340 | Cauchois | July 31, 1956 |
| 2,774,873 | Rieke | Dec. 18, 1956 |
| 2,897,352 | Smith-Vaniz | July 28, 1959 |